United States Patent [19]

Bullock

[11] Patent Number: 5,365,541
[45] Date of Patent: Nov. 15, 1994

[54] MIRROR WITH PHOTONIC BAND STRUCTURE

[75] Inventor: Donald L. Bullock, Los Angeles, Calif.

[73] Assignee: TRW Inc., Redondo Beach, Calif.

[21] Appl. No.: 1,231

[22] Filed: Jan. 27, 1993

Related U.S. Application Data

[63] Continuation-in-part of Ser. No. 827,108, Jan. 29, 1992, abandoned.

[51] Int. Cl.[5] ................................................ H01S 3/19
[52] U.S. Cl. ........................................ 372/99; 372/50; 372/97; 372/19
[58] Field of Search ...................... 372/99, 18, 19, 102, 372/107, 50, 97

[56] References Cited

U.S. PATENT DOCUMENTS

| | | | |
|---|---|---|---|
| 3,835,414 | 9/1974 | Ahearn | 372/99 X |
| 4,280,107 | 7/1981 | Scifres et al. | 372/99 |
| 4,805,176 | 2/1989 | Botez et al. | 372/29 |
| 4,881,236 | 11/1989 | Brueck et al. | 372/45 |
| 4,881,237 | 11/1989 | Donnelly | 372/50 |
| 4,940,303 | 7/1990 | Abeles et al. | 372/24 |
| 4,972,427 | 11/1990 | Streifer et al. | 372/92 |
| 4,987,096 | 1/1991 | Ishikawa et al. | 437/129 |
| 4,995,050 | 2/1991 | Waarts et al. | 372/95 |
| 5,001,719 | 3/1991 | Trussell | 372/50 |
| 5,012,477 | 4/1991 | Mesquida et al. | 372/50 |
| 5,023,882 | 6/1991 | Paoli | 372/50 |
| 5,027,359 | 6/1991 | Leger et al. | 372/95 |
| 5,033,054 | 7/1991 | Scifres et al. | 372/50 |
| 5,033,060 | 7/1991 | Leger et al. | 372/97 |
| 5,045,897 | 9/1991 | Ahlgren | 372/50 |
| 5,056,098 | 10/1991 | Anthony et al. | 372/45 |
| 5,058,121 | 10/1991 | Paoli | 372/50 |
| 5,060,028 | 10/1991 | Kuo et al. | 372/45 |
| 5,138,628 | 8/1992 | Pocholle et al. | 372/99 |

OTHER PUBLICATIONS

Peterson, I., "Shining A Bright Light On Quantum Darkness", *Science News* vol. 138, pp. 196–197, Sep. 29, 1990.

Kapon, Eli and Orenstein, Meir, "Large Two–Dimensional Arrays of Phase–Locked Vertical Cavity Surface Emitting Diode Lasers", *Optics & Photonics News*, p. 8, Dec., 1991.

Peterson, I., "Drilling holes to keep photons in the dark", *Science News*, p. 227, Nov. 2, 1991.

Dong, Jie et al., "A GaInAsP/InP Grating Filter Multiple-Stripe Laser Array Operating in In–Phase Lateral– And Single–Longitudinal–Mode", Tokyo *Institute of Technology*, pp. 1–16, Jan. 14, 1992.

*Primary Examiner*—Rodney B. Bovernick
*Assistant Examiner*—Hemang Sanghavi

[57] ABSTRACT

An apparatus for achieving in-phase mode operation of a diode laser. A photonic band gap mirror (photonic crystal) having a periodic lattice structure is placed in front of light emitted from one side of the laser diode array. Because of an incomplete photonic band gap in the photonic crystal, light normal to the crystal will be primarily reflected while light at an angle will be primarily transmitted through the mirror. Since in-phase emission is primarily normal and out-of-phase emission primarily off axis, the reflected light which is directed back into the laser cavity will be the predominant lasing mode. The out-of-phase mode primarily transmitted will have significantly larger losses. The resulting laser diode apparatus will therefore operate in-phase and produce a single lobe far-field distribution.

29 Claims, 7 Drawing Sheets

MIRROR WITH PHOTONIC BAND STRUCTURE

CROSS REFERENCE TO RELATED APPLICATION

This application is a continuation-in-part of Ser. No. 07/827,108, filed Jan. 29, 1992, which is now abandoned, entitled "Laser Array Coupling Using Mirrors with Photonic Band Structure" by Donald L. Bullock.

BACKGROUND OF THE INVENTION

1. Technical Field

This invention relates to photonic band structures, and more particularly to photonic band structure laser resonator mirrors for improving the far field pattern of diode laser arrays and broad area devices.

2. Discussion

Semiconductor diode laser arrays and broad-area devices are useful in applications where a high output is required as compared to the power available from a single coherent diode laser. Such applications include optical computing, multichannel optical interconnects, free space optical communication systems, laser printers, etc. Coherent single element diode lasers are currently limited in power to outputs on the order of 30 milliwatts (mW). On the other hand, arrays of single diode lasers or lasers with a single broad lasing area can be designed to provide output powers of hundreds or even thousands of milliwatts. The difficulty is to make them spatially and temporally coherent as well.

It is well known that arrays of laser emitters can oscillate in one or more of several possible configurations known as array modes. Similarly, broad-area devices can oscillate simultaneously in one or more of the transverse and longitudinal modes of the associated laser resonator. In the most desirable array mode, all of the emitters oscillate in-phase. This is known as the zero-degree-phase-shift array mode, and it produces a far-field pattern in which most of the energy is concentrated in a single lobe, the width of which is diffraction-limited. Such a diffraction-limited beam is one whose angular spread is limited only by the diffraction of light to a value roughly equal to the wavelength of the emitted light divided by the width of the emitting source. Correspondingly, the most desirable broad-area mode is the one whose wavefront is most uniform in phase. This mode is analogous to the zero-degree-phase-shift array mode and also produces a single lobe diffraction-limited beam.

When adjacent laser emitters are 180 degrees out of phase, the array operates in the 180-degree-phase-shift array mode and produces two off-axis lobes in the far-field pattern of a one-dimensional array and four off-axis lobes in the far-field pattern of a two-dimensional array. The lobes are separated by an angle whose tangent is equal to the wavelength divided by the near field interelement spacing. There are other array modes with far-field patterns between these extremes. Broad-area modes have similar characteristics. Many laser arrays and broad-area devices operate, particularly at higher power, in two or three array modes or transverse modes simultaneously and produce one or more beams that are typically two or three times wider than the diffraction limit. Although various configurations have been proposed to obtain high output power laser arrays, as well as diffraction limited beams, they all have significant limitations, either in their operating characteristics or in the complexity and cost of their fabrication.

Thus it would be desirable to provide a laser diode array or broad-area device which operates at relatively high power and which produces a single-mode diffraction-limited beam. It would also be desirable to provide a laser diode array or broad-area device which couples the laser diodes to operate in a zero-phase-shift array mode to produce a single-main-lobe far-field pattern or which operates in the uniform phase transverse mode. It would also be desirable to provide a laser diode array or broad-area device which is simple and inexpensive to produce.

SUMMARY OF THE INVENTION

Pursuant to the present invention, a technique is provided for forcing the individual laser elements of a laser diode array or broad-area device to lase in the preferred in-phase mode. This is accomplished by increasing the threshold of all other modes by placing a mirror material with a specific kind of photonic band structure at one or both ends of the array of individual diode laser elements to be coupled. The apparatus includes (1) a laser array comprised of multiple semiconductor diode lasers spaced parallel to each other at regular intervals in a one-dimensional or two-dimensional configuration, closely enough to produce array coupling, or (2) a broad-area device consisting of a monolithic gain region not differentiated into separate laser elements. A region with a periodic lattice structure of regular geometric shapes centered on the lattice points and having a first index of refraction or conductivity is disposed at one end of the array. The interstitial medium has a second index of refraction which is different from the first index of refraction or conductivity. The periodic lattice structure may function as one or both of the laser resonator end mirrors for the array. The reflection and transmission properties of the mirror for individual angular components of the modes depend on the photonic band structure of the periodic lattice structure. This feature is central to the invention. The periodic lattice structure has particular designs for the geometrical shapes and spatial periods in two or three dimensions which are chosen so that angular components of the light emitted cooperatively by the gain medium are substantially reflected by the periodic lattice structure only if incident at, and in a prescribed angular region near, a normal angle of incidence for the wavelength of interest. This property is determined by the associated photonic band structure. In effect, this property causes the mirror to function in the near-field of the mode in a manner similar to that of a spatial filter if placed in the far-field of the mode. Thus, the use of such a mirror is a technique for inducing mode control. The angular width of the prescribed region is determined by the need to keep it of the order of the diffraction limit for the device. This reflection condition increases the threshold for other modes relative to that of the uniform or symmetric array mode by reducing the mirror reflectivity for these other modes. Consequently, the uniform-phase or symmetric array modes, which consist primarily of light whose principal angular components are incident at or near normal incidence to the mirror, will be the selected modes for lasing. As a result the far-field distribution pattern of the apparatus consists of a single lobe of concentrated laser energy.

Furthermore, the periodic lattice structure mirror of the present invention may be used in applications other than laser cavities where spatial filtering is desired. Also, the present invention is useful in applications involving a wide range of wavelengths ranging from low frequency radio waves to X-rays.

BRIEF DESCRIPTION OF THE DRAWINGS

The various advantages of the present invention will become apparent to one skilled in the art by reading the following specification and by reference to the following drawings in which.

DESCRIPTION OF THE PREFERRED EMBODIMENTS

Figure 1:
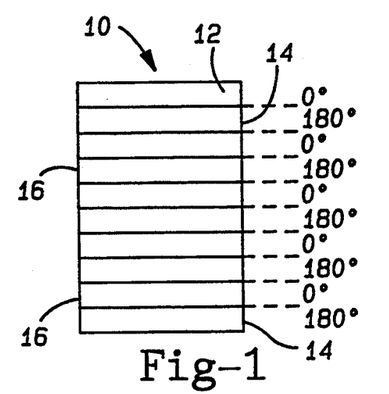
FIG. 1 is a diagram of a laser diode array operating in an out-of-phase mode.

Referring to FIG. 1 there is shown a conventional diode laser array 10 which comprises a one dimensional array of 10 individual diode lasers 12. It will be appreciated that the diode laser array 10 shown in FIG. 1 is not drawn to scale to facilitate illustration. Each semiconductor diode laser 12 is a multilayered structure composed of different types of semiconductor materials, chemically doped with impurities to give them either an excess of electrons (n-type) or an excess of electron vacancies or holes (p-type). The basic structure of the semiconductor laser 12 is that of a diode, having an n-type layer, a p-type layer and an undoped active layer sandwiched between them. When the diode is forward-biased in a normal application, electrons and holes combine in the region of the active layer, and light is emitted. The layers on each side of the active layer usually have a lower index refraction than the active layer, and function as cladding layers in a dielectric wave guide that confines the light in a direction perpendicular to the layers. Various techniques are usually employed to confine the light in a lateral direction as well, and crystal facets 14 and 16 are located at opposite ends of the structure, to provide for repeated reflections of the light back and forth in a longitudinal direction in the structure. If the diode current is above a threshold value, lasing takes place and light is admitted from one of the facets, such as 14, in a direction generally perpendicular to the emitting facet.

Figure 2:
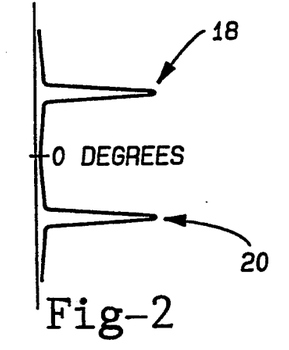
FIG. 2 is a diagram of the far-field pattern produced by the out-of-phase laser diode array of FIG. 1.

The individual diode lasers 12 can oscillate in a plurality of array modes. The array shown in FIG. 1 is operating in an out-of-phase mode with adjacent diode lasers 12 180 degrees out of phase. Lasing will occur in any mode that is above threshold, that is, which has enough gain and enough reflectivity from the mirrors or facets to achieve lasing. FIG. 2 is a diagram of the far-field light intensity produced by laser array 10 shown in FIG. 1. The far field pattern as shown in FIG. 2 may be viewed as arising from two waves traveling in directions within the laser array that make equal and opposite angles with respect to the normal to the end facets. This results in a standing wave interference pattern in the intensity within the array that gives rise to maxima which coincide with the center of the laser diode elements. Adjacent maxima have associated fields with phases of opposite signs, consistent with the out-of-phase excitation of the array diode elements. Because the array 10 is shown radiating in an out-of-phase mode, the principal plane wave components of the mode radiated from the facets 14 make equal and opposite angles with respect to the optical axis of the diode lasers 12. This results in two principal lobes in the far-field, the first 18 and the second 20 which occur spaced at angles approximately $\lambda/2\omega$ on either side of the central axis (labeled "zero degrees"), where omega ($\omega$) is the distance between diode laser elements in the array.

Figure 3:
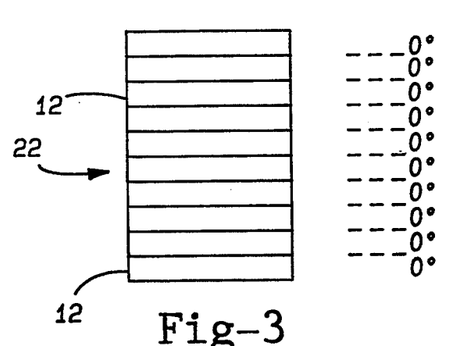
FIG. 3 is a diagram of a laser diode array operating in the in-phase mode.
Figure 4:
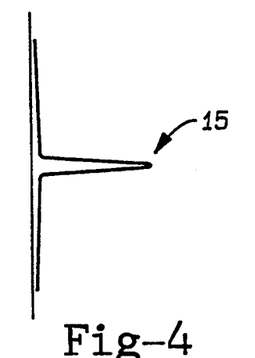
FIG. 4 is a diagram of the far-field pattern of an in-phase laser diode array.

Unfortunately, a far-field pattern such as the one shown in FIG. 2, does not produce a satisfactory concentration of light energy in a singular far-field lobe in applications where relatively high directionality of the radiated power is required. It would be desirable to have all of the light energy concentrated in a single diffraction limited main beam. Such a beam would be produced by a laser diode operating in an in-phase mode (zero degree phase shift mode) such as the one shown in FIG. 3. The diode laser array 22 of FIG. 3 has individual lasers 12 producing light which is in-phase, and results in the far-field pattern 15 shown in FIG. 4. It will be appreciated that similar arguments apply when the device is a broad area device, i.e., the most desirable mode is the one with the most uniform phase distribution and which produces a far-field with a single diffraction-limited main lobe.

A number of methods have been proposed to resolve this problem including the designing of the array in such a way as to force the excitation of the out-of-phase mode, followed by the use of phase shifters to convert the array near-field from an out-of-phase distribution to an in-phase distribution. However none of these prior approaches are entirely satisfactory either from a cost performance or a complexity standpoint. The solution offered by the present invention utilizes a mirror in the form of a photonic crystal to force a diode laser array to lase directly in the preferred in-phase mode and thereby produce a single concentrated far-field pattern such as the one shown in FIG. 4.

Photonic crystals have been developed in an effort to fabricate a material that excludes photons of a certain frequency range from existing in the crystal. Such a structure would prevent devices embedded within it which contain atoms in an excited state from spontaneously emitting light at frequencies that fall within the excluded range, or band gap. At least one configuration has been proposed for a photonic crystal which would achieve the result of complete suppression of spontaneous emission within a certain frequency range regardless of the direction of travel of the photon within the crystal. See, for example, Eli Yablonovitch, "Inhibited Spontaneous Emission in Solid-State Physics and Electronics", Phys. Rev. Lett. 58, 2059 (1987) and K. M. Ho, C. T. Chan, and C. M. Soukoulis, "Existence of a Photonic Gap in Periodic Dielectric Structures", Phys. Rev. Lett. 65, 3152 (1990). The work on photonic band gaps is based on an analogy with the band theory of solids, which is a quantum mechanical theory of allowed electron energy states in periodic potentials. Band theory predicts, using the Schroedinger equation, that an electron in a periodic potential will have certain restricted ranges or bands for the allowed energies of the electrons and, correspondingly, will have certain energy states which are not allowed if the bands do not overlap in energy.

Yablonovitch recognized the mathematical similarity between the Schroedinger equation and the Helmholtz equation which describes the propagation of electromagnetic waves. As a result, Yablonovitch applied the ideas of the band theory of solids to the situation of the effect of a periodic "potential", i.e., periodic variation in the index of refraction, on electromagnetic waves. Thus, he reasoned by analogy, a structure with a periodic index of refraction variation (in place of the periodic Coulomb potential of a solid) should result in a situation where some photon states $(\omega,k)$ are allowed and others are not allowed. $(\omega=2\pi f$, k is a vector whose magnitude is $2\pi/\lambda$, and whose direction is the direction of propagation of the wave.) More recently, it has been recognized that even more important than the Schroedinger equation is the periodicity and vector nature of the field. For further information refer to the above cited articles by Yablonovitch and Ho et al. The goal of the work of Yablonovitch and others working in this field of photonic crystals is to build a structure in which a band gap exists for a band of frequencies regardless of the direction in space that the electromagnetic wave is propagating in the lattice. Such a band gap can be termed a $4\pi$ steradian band gap. This kind of structure would deny propagation to some band of frequencies in all directions in space. For example, such a structure would not allow spontaneous emission at that band of frequencies, and would have wide application in many areas.

Figure 5:
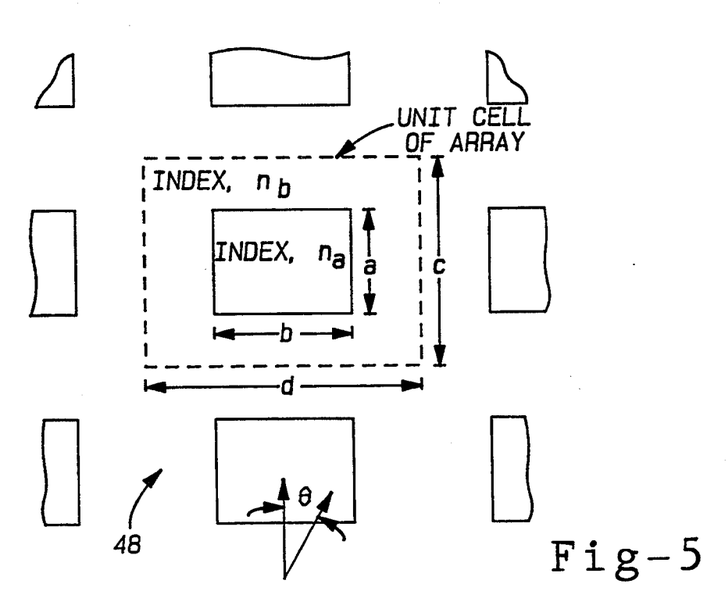
FIG. 5 is a top view of the periodic rectangular array of the photonic band gap mirror of the present invention showing the lattice unit cell, the lattice cell parameters, a, b, c, and d, the areas affected by the two indices of refraction, $n_a$ and $n_b$, and the angle of incidence of the wave on the lattice, $\theta$.
Figure 6:
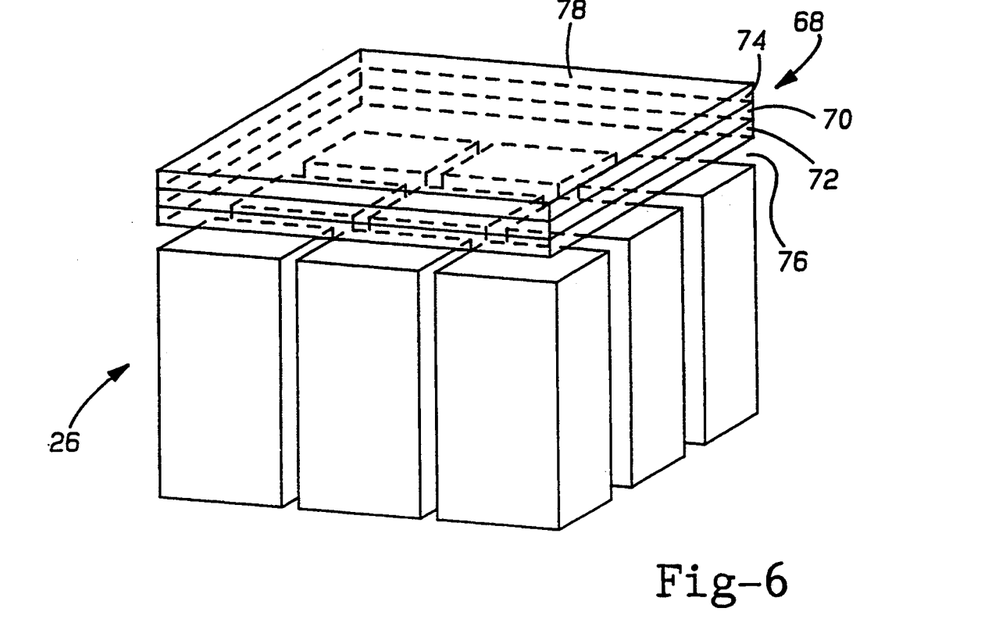
FIG. 6 is a diagram of a two dimensional periodic structure consisting of a closely packed array of square rods.

Nevertheless, the work in this relatively new field of photonic crystals has so far produced only one such structure having a true $4\pi$ steradian band gap. This structure has the spatial periodicity of the lattice associated with the diamond crystal (See Ho et al.). Instead, most work to date has only produced structures which have gaps that are not complete, i.e., do not exist for all angles at any single frequency much less over a given frequency range. Investigations have been carried out for two-dimensional as well as three-dimensional lattices. (in the two-dimensional case a complete gap would be characterized by existing over a $2\pi$ radian angular range in the plane of the two dimensions, rather than the $4\pi$ solid angle range of three dimensions.) For example, the photonic crystals shown in FIGS. 5 and 6 are two-dimensional lattice configurations. The properties of these lattice configurations determine the existence or non-existence of the possibility of the propagation of electromagnetic waves at a given frequency through the structure at a given angle. Electromagnetic wave states, i.e., waves with a given $(\omega,k)$, which cannot exist within the lattice configuration are correspondingly reflected from the surface of the volume containing the lattice if an attempt is made to introduce them from the outside.

Figure 8:
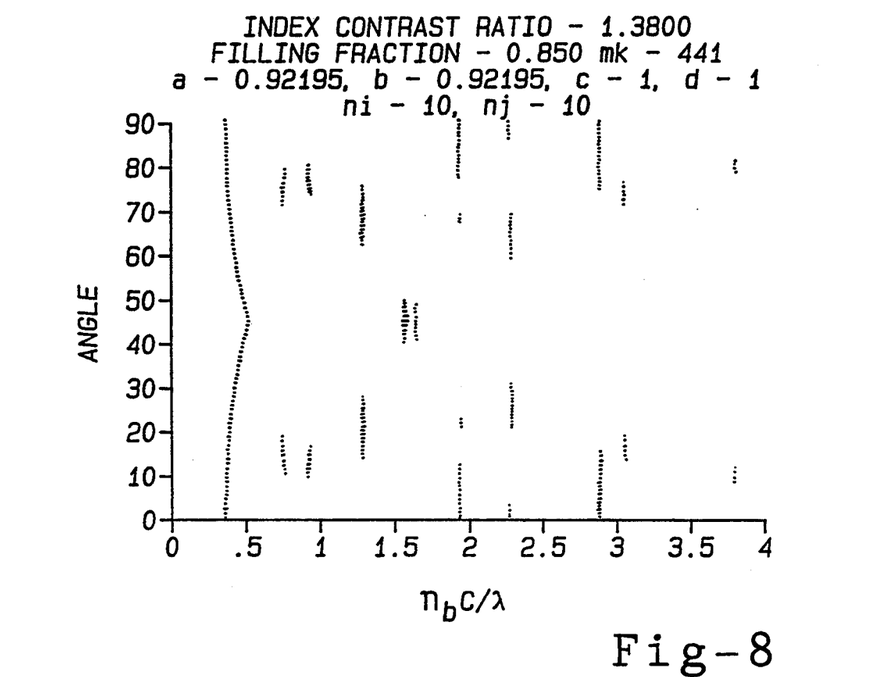
FIG. 8 is a diagram of the photonic band structure for transverse electric (TE) electromagnetic waves for the array of square rods shown in FIG. 6 showing the frequencies, f, of electromagnetic waves which are not allowed (black regions) as a function of both the angle $\theta$ and the frequency parameter $c/(\lambda/n_b)$, where $\lambda$ is the free-space wavelength and is equal to $c'/f$, where $c'$ is the velocity of light in vacuum, and the index contrast ratio, or $n_a/n_b$, has been arbitrarily set to 1.38 for this example.

In more detail, FIG. 6 illustrates a two dimensional periodic structure comprised of a closely packed array of square rods. The allowed propagation states for electromagnetic waves incident upon the periodic structure 26 in FIG. 6 is illustrated in the graph of FIG. 8, where the ordinate is in units of the angle of incidence, $\theta$, from zero to 90 degrees and the abscissa is in units of $n_b c/\lambda$; where $\lambda=$the free-space wavelength, (For the definition of the parameters in the above quantities, see FIG. 5.) The rods have an index contrast ratio, $n_a/n_b$, of 1.38. The ratios a/c and b/d are equal to 0.92195, so that the so-called filling factor (ab/cd) is 0.85. The white areas in FIG. 8 indicate areas where waves are allowed in the structure 26; and the shaded areas are areas where waves are not allowed in the structure, and therefore represent stop bands.

Figure 7:
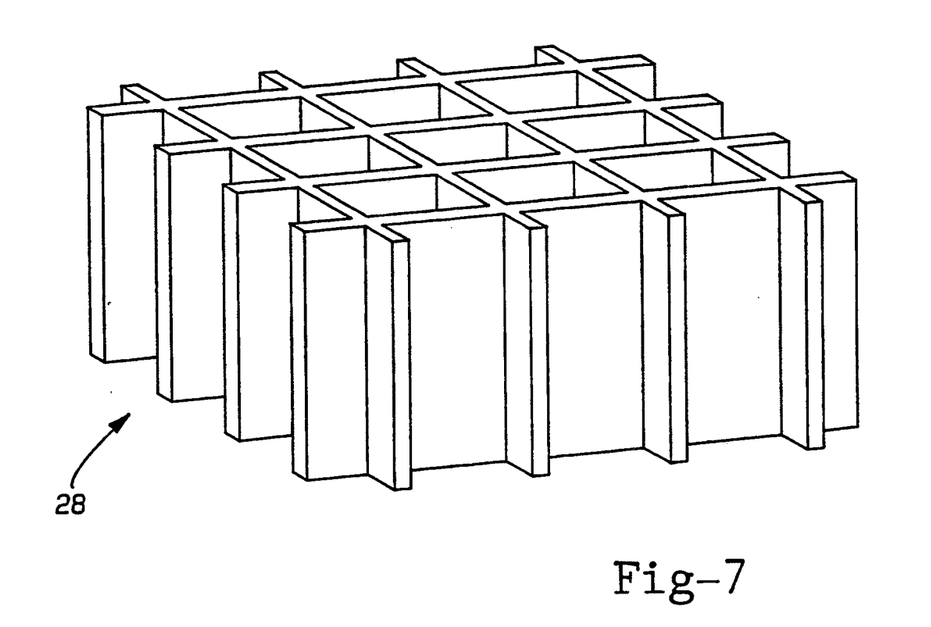
FIG. 7 is a two dimensional periodic structure consisting of a thin grid.
Figure 9:
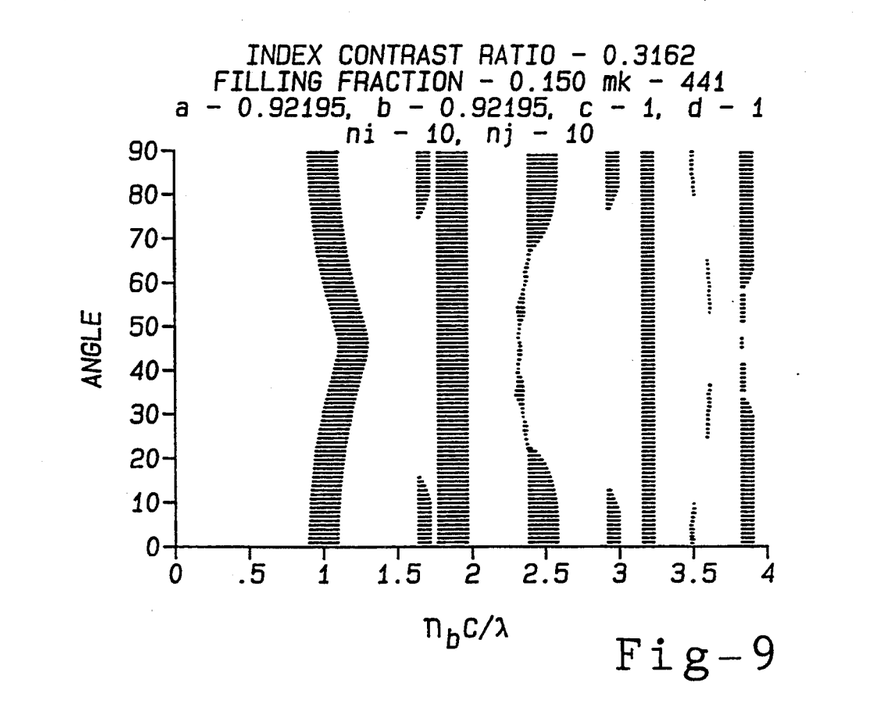
FIG. 9 is a diagram similar to that of FIG. 8 for the thin grid shown in FIG. 7 where the index contrast ratio is 0.3162.

The band gaps shown are due to the above-discussed photonic band gap phenomenon. It is noted that the band gap is incomplete in the sense that it depends on the angle of incidence and is not a $2\pi$ radian band gap as is desired in two dimensional photonic crystals. (The structures shown are two-dimensional, but their investigation is of interest, too, and the interpretation of their response helps in the interpretation of the response of three-dimensional structures.) A complete band gap ($2\pi$ radian band gap) would be one in which a shaded area exists from zero to 90 degrees for this square lattice for some region along the abscissa. FIG. 7 illustrates an alternative photonic crystal comprised of a thin grid 28 having an index contrast of 3.32. The allowed frequencies and angles of propagation for the thin grid 28 are shown in FIG. 9. A $2\pi$ steradian band gap exists for TE waves near $n_b c/\lambda=2.0$ and 3.0. An additional investigation (not shown) shows that, the transverse magnetic (TM) wave spectrum does not include these gaps, so that the gap is not complete for both polarizations.

Much work continues in the area of photonic crystals to develop structures with either $2\pi$ radian or $4\pi$ steradian band gaps. Nevertheless, the present inventor has recognized that the incomplete band gaps present in current photonic crystals, while perceived as a problem in that field, represents a phenomenon which has utility in entirely different fields. In particular it has been discovered that while the goal of the above-discussed work in photonic crystals is to develop a $4\pi$ steradian band gap in a three-dimensional structure, the incomplete band gap in most structures, both two- and three-dimensional, can be used to improve the performance of diode laser arrays. The present invention makes use of the dependence of the reflectivity of a photonic crystal on the angle of incidence as a way to cause a diode laser array to select in-phase modes in favor of out-of-phase modes.

In brief, in the present invention a photonic crystal is used as a mirror in which in-phase, or more nearly in-phase laser elements will experience a higher reflectivity from the mirror than modes that are less in-phase. The in-phase mode of a diode laser array is constructed from plane wave components which are incident normal, or nearly normal, to the mirror. In contrast, the out-of-phase or less desirable modes are made up from plane wave components which are incident on the mirror at angles further away from the normal. This property results in the far-field patterns discussed above and shown in FIGS. 2 and 4. The differing directions of the plane-wave components of the in-phase versus out-of-phase modes can be used to selectively reflect in-phase plane waves, which will lead to lasing in the in-phase, or mostly nearly in-phase mode. This is because the other modes will experience significantly higher losses at the mirror and will thus be kept below threshold in the presence of lasing in the less lossy in-phase mode. Stated a different way, the mirror will introduce mode control.

In the preferred embodiment the structure 26 in FIG. 6 includes a slab waveguide 68 which guides the incident radiation in one dimension. This consists of a flat waveguide region 70 sandwiched between two regions of higher index 72, 74. Also a gap 76 exists between the waveguide 68 and the periodic structure 26. Also shown is the waveform 78 of the indicent light, which has its maximum amplitude inside the inner waveguide region 70.

Figure 10:
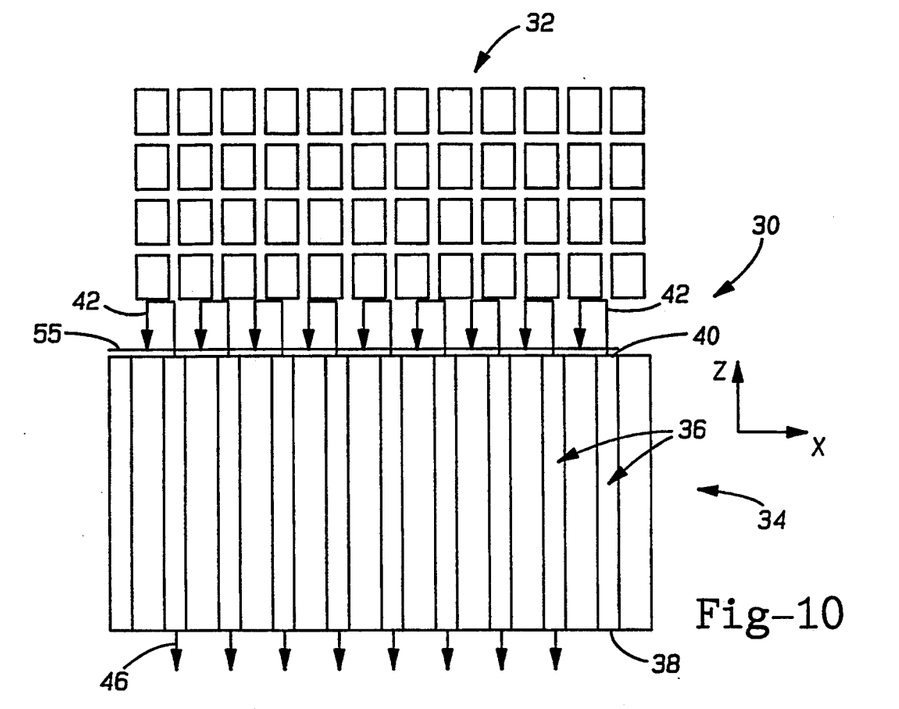
FIG. 10 is a diagram of a semiconductor diode laser array incorporating a photonic band gap mirror in accordance with the present invention illustrating the in-phase mode.

Referring now to FIG. 10, a one-dimensional semiconductor diode laser array with a photonic band gap end mirror 30 in accordance with the present invention is shown. It includes a periodic structure of square rods 32 which comprises a photonic band gap mirror.

Figure 11:
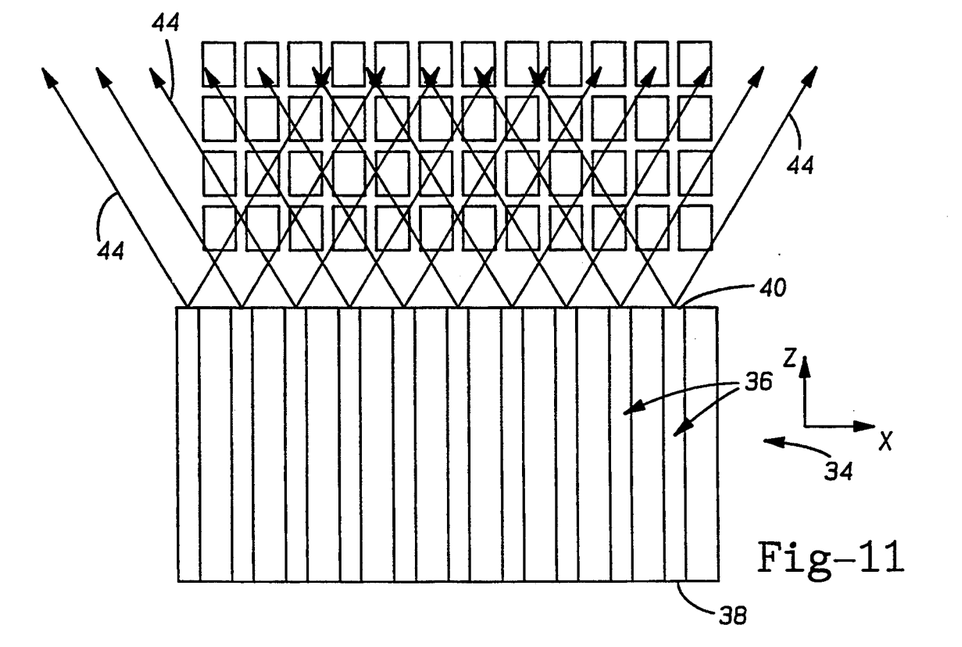
FIG. 11 is a diagram of a semiconductor diode laser array incorporating a photonic band gap mirror in accordance with the present invention illustrating the out-of-phase mode.

A semiconductor diode laser array 34 comprises a plurality of individual diode lasers 36 spaced at regular intervals which may for example be between 3 and 5 microns. At one end of the diode lasers 36 is a partially reflecting facet or mirror 38. It will be appreciated that the facet 38 is typically produced when the single crystal laser diode is cleaved which results in an air interface with the material (such as gallium arsenide) which yields a 30 percent reflectivity at the boundary due to the different indices of refraction. Normally, a similar partially reflecting facet mirror 40 would be placed at the other end of the array 34. It will be appreciated that conventionally, the laser diode array would operate in both in-phase and out-of-phase modes. The in-phase mode is illustrated by the rays 42 propagating in a direction generally along the optic axis of the laser 36. An example of an out-of-phase mode of the laser 34 is the 180° out-of-phase mode illustrated in FIG. 11 showing the propagation of light rays 44 at some angle, for example 5 to 10 degrees, with respect to the optical axis of the laser. The in-phase mode wave can be described in terms of a single plane wave component according to the following equation:

$$E(z) = E_0 \exp(-jkz) \quad (1)$$

where $E_0$ is the amplitude of the electric field, j is the square root of $-1$, and k is $2\pi/\lambda$, and z is the direction of propagation. The out-of-phase mode wave shown in FIG. 10, can be described in terms of two plane wave components by the equation:

$$E(z) = E_0 \{\exp[-j(k_z z + k_x x)] + \exp[-j(k_z z - k_x x)]\}/2 = E_0 \exp(-jk_z z) \cos(k_x x) \quad (2)$$

where the x and z directions are defined in FIGS. 10 and 11. The square root of the sum of the squares of $k_x$ and $k_z$ in Eq. (2) is equal to $2\pi/\lambda$. The first and second terms in the braces on the right hand side of Eq. (2) represent the two components of the wave 44 propagating to the left and to the right, respectively. Other out-of-phase modes containing different plane wave component content may be described similarly.

Without the photonic band gap mirror, the diode laser array 34 may lase in any one or in any combination of the array modes, including the in-phase and 180° out-of-phase modes. However, with the photonic band gap mirror 32 in place the in-phase mode will be the most highly reflected mode and the 180° out-of-phase mode 44 will be the most highly transmitted mode through the mirror 32. The reflectivity of the other modes will lie in between these extremes. This is exactly the condition which is required to produce a device mode control which will favor the in-phase mode. This results from the fact that the in-phase mode 42 is made up from plane wave components which are the most heavily weighted of all of the modes towards those incident normal, or nearly normal, to the band gap mirror, while the 180° out-of-phase mode 44 is made up from components weighted away from the normal, and the other modes are in between. As a result, the in-phase light 42 will be predominantly reflected back into the cavity of the lasers 36. Because of the nearly 100 percent reflection for the in-phase mode and the lower reflectivities for the other modes, there will not be enough gain at saturation within the laser for the other modes to cause significant lasing in those modes. Hence, the quality factor (Q) for the in-phase mode is increased at the expense of the other modes and as a result the operation of the laser will be primarily in the in-phase mode. Consequently, light 46 emitted out of the opposite side of the lasers 36 will be predominantly in-phase and will produce a far field pattern such as the one shown in FIG. 4. In the preferred embodiment, the slab waveguide 68 will cover the periodic structure 32 so that the center of the laser outputs are directed into the waveguide 68 and the periodic structure 32 is offset somewhat.

Figure 12:
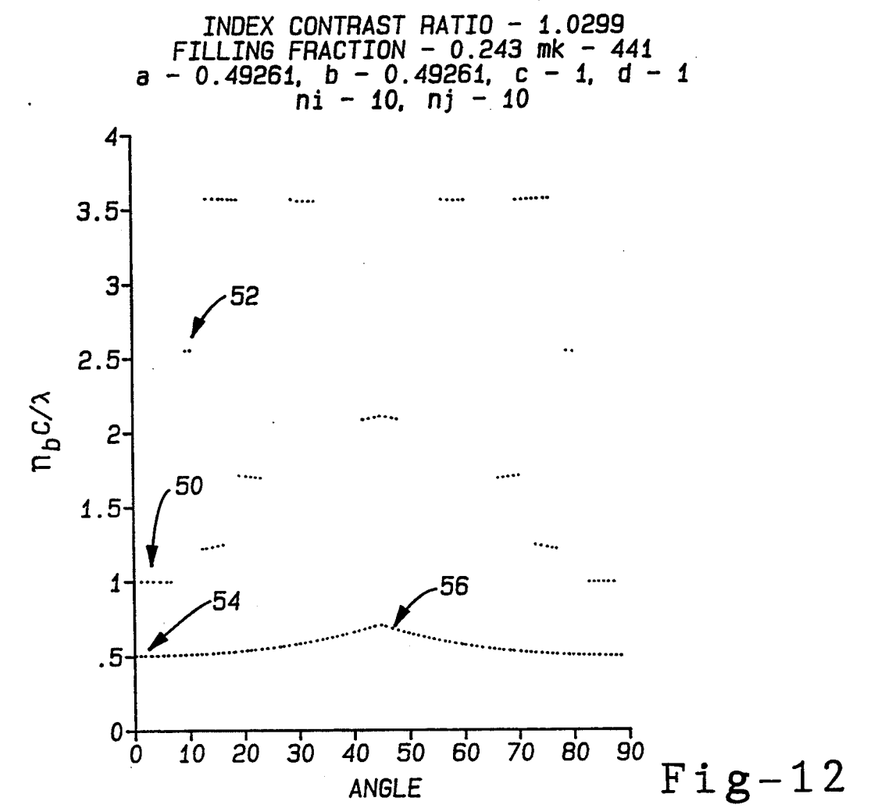
FIG. 12 is a diagram of the photonic band structure for a two dimensional rectangular, non-square array having an index contrast ratio of 1.03 and a rectangular aspect ratio, d/c and b/a, of 2.0.
Figure 13A:
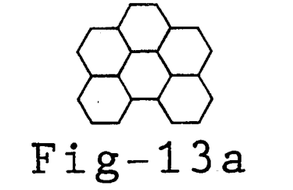
FIGS. 13(a)–(e) are diagrams of the five two dimensional Bravais lattices.
Figure 13B:
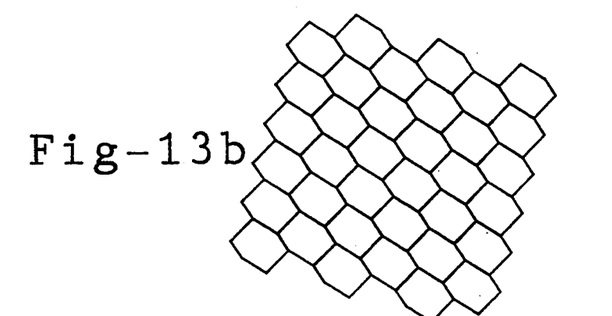
Figure 13C:
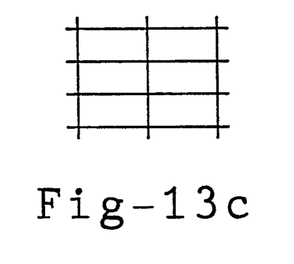
Figure 13D:
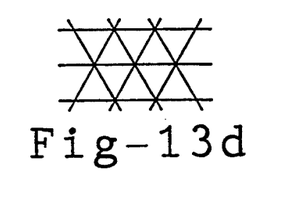
Figure 13E:
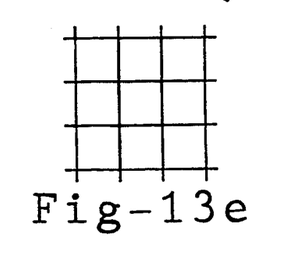
Figure 14A:
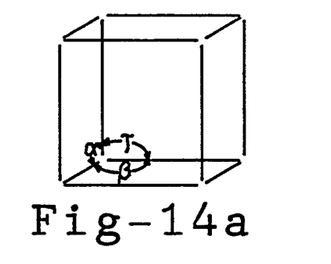
FIGS. 14(a)–(n) are diagram of the fourteen three dimensional Bravais lattices.
Figure 14B:
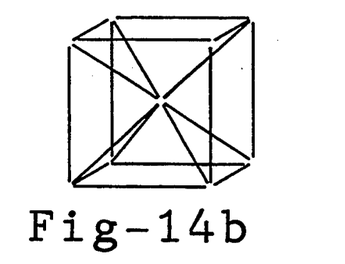
Figure 14C:
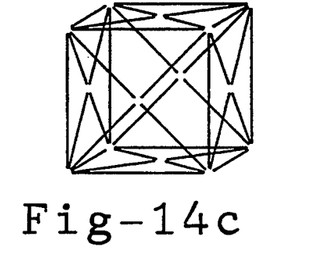
Figure 14D:
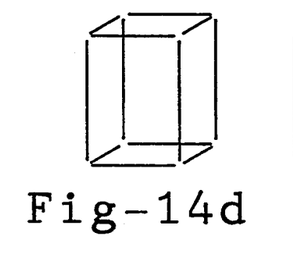
Figure 14E:
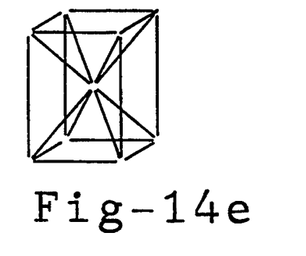
Figure 14F:
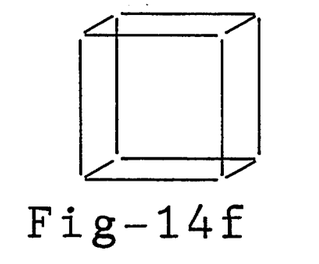
Figure 14G:
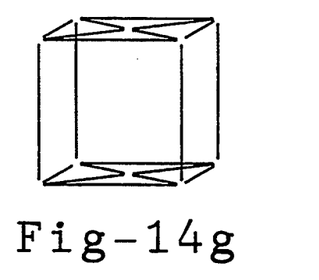
Figure 14H:
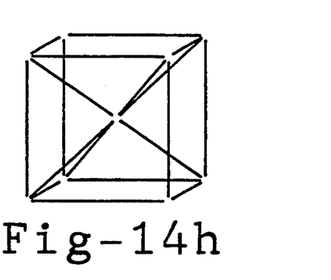
Figure 14I:
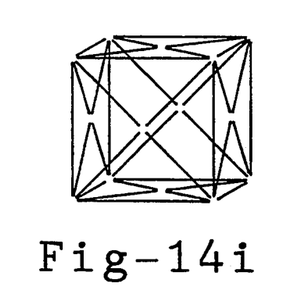
Figure 14J:
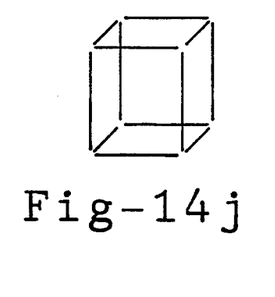
Figure 14K:
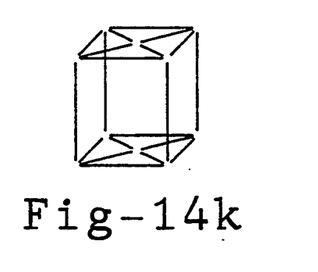
Figure 14L:
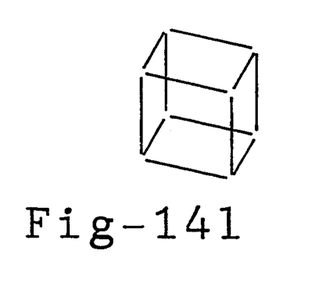
Figure 14M:
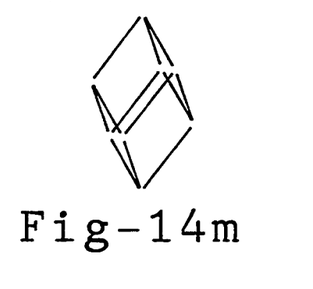
Figure 14N:
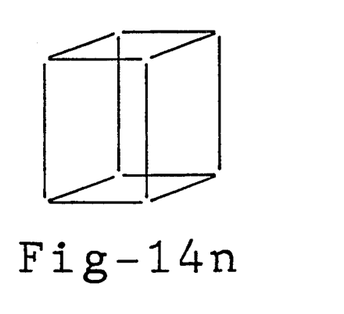

To produce a photonic band gap mirror with the desired characteristics shown in FIGS. 10 and 11, it is necessary to analyze the photonic band structure of the photonic crystal and to select a structure having a configuration which produces the desired reflecting and transmitting characteristics at the frequency of the diode lasers. Referring now to FIG. 12, a graph of the reflecting and transmitting characteristics of a two-dimensional array of squares is plotted showing angular dependence on the reflectivity as a function of the frequency parameter $n_b c/\lambda$, where c is equal to the periodic spacing of the array of squares and $\lambda$ equals the free-space wavelength of light. (If the mirror is a two-dimensional one embedded in a slab waveguide structure in the third dimension, then $\lambda$ is the guide wavelength.) This array of squares 48 (such as the one shown in FIG. 5) is similar in shape to the array of square rods 26 shown in perspective view in FIG. 6. For purposes of this calculation, as represented in FIG. 12, it is assumed that the square rods extend indefinitely both into and out of the plane of the page in FIG. 5. Of course, it will be appreciated that to construct a functioning photonic band gap mirror in accordance with the present invention the rods will not be infinite in dimension but will be finite such as shown in FIGS. 6 and 7. Thus, the periodic index structure would be one involving an effective rather than an actual index contrast ratio. While many dielectrics may be used in the preferred embodiment, the rods were composed of gallium arsenide and the space between the rods is composed of gallium aluminum arsenide. This results in an effective index contrast ratio of about 1.03. The lattice period c is shown in FIG. 5 (c=d and a=b in FIG. 5, for a square array) as the distance between the centers of the individual square rods. Also the angle of incidence of the electromagnetic wave, $\lambda$, is also shown in FIG. 5.

Referring again to FIG. 12, to achieve the performance of the photonic band gap mirror 32 in FIGS. 10 and 11, it is desirable to have a photonic band structure that exhibits high reflectivity only for light restricted to a small angular region, that is, $\Delta\theta$ of the order of $\pi\lambda/D$, where D is the width of the array. This angular width is typically of the order of one degree (approximately 25 elements). In the case shown in FIG. 12, the design of which has not been optimized, there are a number of regions of high reflectivity (dark areas) which are of the order of a few degrees in width. For example, at the region where $n_b c/\lambda$ is approximately 1.0 (corresponding to the lattice parameter c being about 1.0 wavelengths as measured in the region with index $n_b$) and $\theta$ is about zero degrees, there is an area of reflectivity 50 which exhibits this characteristic. Some regions of high reflectivity are not only angularly dependent, but also slightly frequency dependent, which is the case with most of the features in FIG. 12. This frequency dependence, while appearing small in FIG. 12, is large when compared with the gain bandwidth of a GaAs laser, and so this feature helps to further restrict the effective angular region over which the laser mirror has high reflectivity. Another possible region to use would be region 52, which occurs at $n_b c/\lambda$ approximately equal to 2.5. Note that region 54 around 0 equal to zero would not be suitable because it reflects too wide a range of angles. However, the region 56 around 45 degrees the frequency variation of this same feature might be used to obtain angular restriction.

It will be appreciated that many other configurations will be possible using different periodic structures. For example, the thin grid 28 shown in FIG. 7 may be employed as may other periodic lattices employing other geometric shapes. For further details of the periodic structures in FIGS. 6 and 7 see Pierre R. Villeneuve and Michel Piche, "Inhibition and Confinement of the Propagation of Transverse Electric Modes in Two-Dimensionally Periodic Media", Conference on Quantum Electronics and Laser Science, 1991 Technical Digest Series, Vol. 11, p. 52, which is hereby incorporated by reference. Also, the present invention may be constructed using one of the five regularly spaced periodic two-dimensional lattice arrays, known as Bravais lattices, shown in FIG. 13. For two-dimensional laser arrays, a three dimensional photonic band structure mirror constructed of one of the 14 three dimensional Bravais space lattices (shown in FIG. 14) may be used. Further, additional shapes known as space groups (of which there are 32) may be used. In any of these cases, one would simply derive the photonic band structure of the array, such as the graph shown in FIG. 12, and choose a suitable wavelength-to-lattice parameter ratio where the photonic crystal lattice has the desired reflecting characteristics over the proper angular range.

The position of the mirror 32 may be altered depending on the particular configuration chosen. The distance between the mirror 32 and the laser should be small enough so that it is within the near field of the laser. Also, the mirror 32 may be disposed at some angle (not parallel) with respect to the laser to optimize performance in some cases.

In a preferred embodiment of the present invention an array of microlenses 55 with the same periodicity of the laser diode array is interposed between the facets 38 of the individual laser diodes 36 and the photonic band gap mirror 32 so that the "fill factor" (also called filling fraction) of the field distribution presented to the mirror is improved. Fill factor is the ratio of the width of the laser cavity 36 to the sum of this width plus the space between adjacent lasers 36. This will have the effect of increasing the reflectivity of the desired mode relative to the undesired modes by increasing the normal and near normal plane wave content of the desired mode. This is effectively done through the angular narrowing of the element factor of the radiation pattern of the array as seen from this position.

It will also be appreciated that the present invention may be employed for one dimensional or two dimensional diode laser arrays. Alternatively, the present invention may be applied to broad-area lasers.

Figure 15:
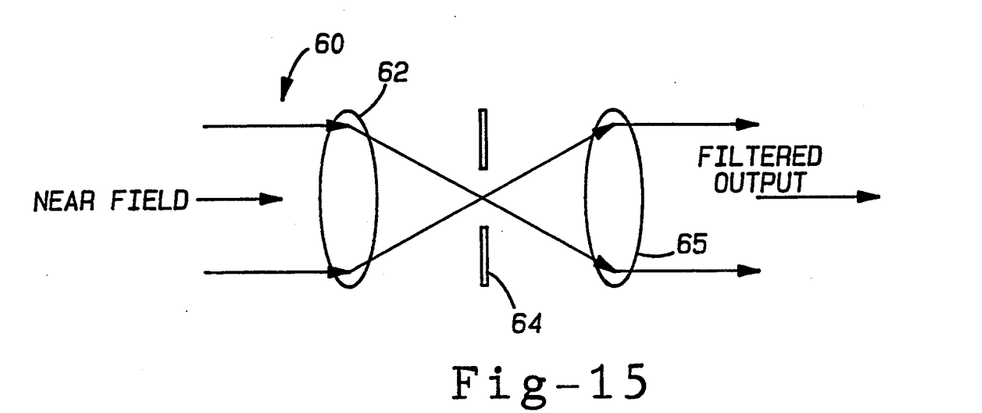
FIG. 15 is a diagram of a conventional spatial filter.
Figure 16:
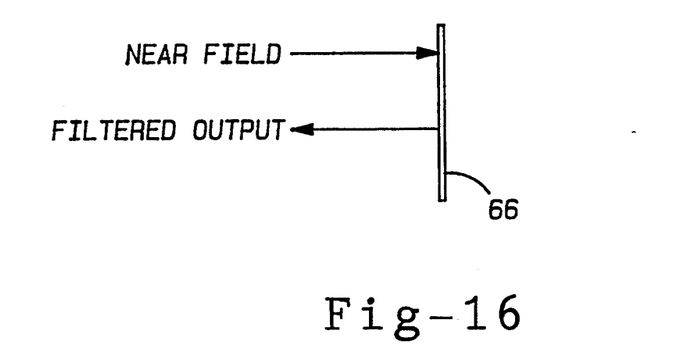
FIG. 16 is a diagram of the photonic band gap mirror of the present invention used as a spatial filter.

Furthermore, the photonic band gap mirror of the present invention may be used in applications other than lasers cavities. In general, the photonic band gap mirror is a form of angular filter for any electromagnetic radiation that is incident upon it. For example, if the mirror is designed to reflect only plane wave Fourier components of the radiation which subtend a certain solid angle about the normal to the mirror surface, then, upon reflection from the mirror surface, the radiation will be filtered in angle so that only these components remain. For example, in accordance with another embodiment of the present invention the photonic band gap mirror is used as a spatial filter. In conventional spatial filters, such as the one shown in FIG. 15, radiation 60 is focused by a lens 62 at a focal plane. An aperture 64 of appropriate size placed in the focal plane will block radiation coming through the lens 62 at angles outside a certain side angle about the normal to the lens. To reconstruct the filtered near field the radiation then passes through a second lens 65 to reverse the process. The result is the removal of a group of Fourier components. The photonic band gap mirror 66 shown in FIG. 16 accomplishes the same kind of spatial filtering but does it in the near field thus avoiding the necessity of a focusing lens and aperture.

The result is a spatial filter that is much more compact, and requires fewer components than a conventional spatial filter.

The photonic band gap mirror of the present invention may be used with a wide range of electromagnetic frequencies ranging from low frequency radio waves up to X-Rays. The incident radiation is preferably coherent, however spatially coherent and temporally incoherent radiation may be used. To the extent that the radiation is spatially incoherent the efficiency will be severely reduced.

Those skilled in the art can appreciate that other advantages can be obtained from the use of this invention and that modification may be made without departing from the true spirit of the invention after studying the specification, drawings and following claims.

What is claimed is:

1. An apparatus including a laser for generating in-phase light from the laser, said apparatus comprising:

a laser producing a light beam at a predetermined wave length;

a periodic lattice structure of regular geometric shapes disposed to receive light from said laser, said structure having a first index of refraction;

an interstitial medium existing between said geometric shapes, said interstitial medium having a second index of refraction which is different from said first index of refraction; and said periodic lattice structure adapted to receive the light beam, said lattice structure having a spatial period between said geometric shapes which is chosen such that the light of symmetric uniphase mode from said laser is selectively reflected with a substantially enhanced reflectivity relative to other modes by said periodic lattice structure as a result of the photonic band structure of said periodic lattice.

2. The apparatus of claim 1 wherein said laser is an array of lasers.

3. The apparatus of claim 1 wherein said laser is a broad area laser.

4. The apparatus of claim 1 wherein said periodic lattice Structure is a three-dimensional structure.

5. The apparatus of claim 1 wherein the regular geometric forms in said periodic lattice structure comprise Bravais lattices.

6. The apparatus of claim 1 wherein the regular geometric shapes are composed of gallium arsenide and the interstitial medium is composed of gallium aluminum arsenide.

7. The apparatus of claim 1 wherein said first index of refraction is greater than said second index of refraction.

8. The apparatus of claim 7 wherein the ratio of said first index of refraction to said second index of refraction is less than 2.0.

9. The apparatus of claim 1 wherein said spatial period is such that light of said wave length is substantially reflected by said periodic lattice structure when incident from said laser on said periodic lattice at angles between $\pm 10$ degrees.

10. The apparatus of claim 1 wherein said periodic lattice structure is a photonic crystal.

11. The apparatus of claim 1 wherein said spatial period is chosen such that the distance between said geometric shapes divided by the wavelength of the light in said laser is between 0.1 and 10.

12. An apparatus including a laser for generating light from the laser, said apparatus comprising:

a laser array producing a light beam at a predetermined wavelength;

a periodic lattice structure comprising a grid creating interstitial spaces between said grid, said lattice disposed to receive light from said laser, said spaces having regular geometric shapes, said grid having a first index of refraction;

an interstitial medium existing between said grid and having a second index of refraction which is different from said first index of refraction; and said periodic lattice structure adapted to receive the laser beam the lattice structure having a spatial period between said geometric shapes which is chosen such that light from said laser of symmetric uniphase mode is selectively reflected with substantially enhanced reflectivity relative to other modes by said periodic lattice structure as a result of the photonic band structure of said periodic lattice.

13. The apparatus of claim 12 wherein said spatial period is such that light of said wave length is substantially reflected by said periodic lattice structure when incident from said laser on said periodic lattice at angles between $\pm 10$ degrees.

14. The apparatus of claim 12 wherein said periodic lattice structure is a three-dimensional structure.

15. The apparatus of claim 12 wherein said regular geometric forms in said periodic lattice structure comprise Bravais lattices.

16. The apparatus of claim 12 wherein said regular geometric shapes are composed of gallium arsenide and the interstitial medium is composed of gallium aluminum arsenide.

17. The apparatus of claim 12 wherein said first index of refraction is greater than said second index of refraction.

18. The apparatus of claim 12 wherein the ratio of said first index of refraction to said second index of refraction is less than 2.0.

19. Diode laser array apparatus, including a laser array having a plurality of semiconductor diode lasers spaced at regular intervals, each diode laser having partially transmitting and reflecting facets at each end, and producing light beams at a predetermined wavelength, said apparatus further comprising:

a periodic lattice structure of regular geometric shapes, said structure having a first index of refraction;

an interstitial medium existing between said geometric shapes, said interstitial medium having a second index of refraction which is different from said first index of refraction; and said periodic lattice structure having a spatial period between said geometric shapes which is chosen such that light of said wavelength from said laser array of symmetric uniphase mode is substantially reflected by said periodic lattice structure as a result of the photonic band structure of said periodic lattice.

20. A photonic band gap mirror for selectively reflecting electromagnetic radiation of a predetermined wave length comprising:

a source of electromagnetic radiation;

a periodic lattice structure of regular geometric shapes disposed to receive electromagnetic radiation from said source of electromagnetic radiation, said structure having a first index of refraction;

an interstitial medium existing between said geometric shapes, said interstitial medium having a second index of refraction which is different from said first index of refraction; and said periodic lattice structure having a spatial period between said geometric shapes which is chosen such that said electromagnetic radiation from said source in a predetermined angle about the normal to the periodic lattice structure is reflected with a substantially enhanced reflectivity as a result of the photonic band structure of said periodic lattice structure.

21. The apparatus of claim 20 wherein the regular geometric forms in the periodic lattice structure comprise a two dimensional Bravais lattice.

22. The apparatus of claim 20 wherein said the regular geometric forms within said periodic lattice structure comprise a three dimensional Bravais lattice.

23. The apparatus of claim 20 wherein said first index of refraction is greater than said second index of refraction.

24. The apparatus of claim 23 wherein the ratio of said first index of refraction to said second index of refraction is less than 2.0.

25. The apparatus of claim 20 wherein said spatial period is such that electromagnetic radiation of said wave length is substantially reflected by said periodic lattice structure when incident from said laser on said periodic lattice at angles between ±10 degrees.

26. The apparatus of claim 20 wherein said periodic lattice structure is a photonic crystal.

27. The apparatus of claim 20 wherein said spatial period is chosen such that the distance between said geometric shapes divided by the wavelength of the light in said laser is between 0.1 and 10.

28. A photonic band gap mirror for selectively reflecting electromagnetic radiation of a predetermined wave length comprising:
a periodic lattice structure of regular geometric shapes disposed to receive said electromagnetic radiation, said structure having a first index of refraction;
an interstitial medium existing between said geometric shapes, said interstitial medium having a second index of refraction which is different from said first index of refraction; and
said interstitial medium having linear interfaces which are aligned substantially parallel to the direction of said electromagnetic radiation, the periodic lattice structure also having a spatial period between said geometric shapes which is chosen such that said electromagnetic radiation in a predetermined angle about the normal to the periodic lattice structure is reflected with a substantially enhanced reflectivity as a result of the photonic band structure of said periodic lattice structure.

29. A photonic band gap mirror for selectively reflecting electromagnetic radiation of a predetermined wave length comprising:
a periodic lattice structure of regular geometric shapes disposed to receive electromagnetic radiation, said structure having a first index of refraction;
an interstitial medium existing between said geometric shapes, said interstitial medium having a second index of refraction which is different from said first index of refraction; and
said periodic lattice structure having a spatial period between said geometric shapes which determines the variation in reflectivity of said electromagnetic radiation as a function of the angle of incidence to the periodic lattice structure, the varying reflectivity being a result of the photonic band structure of said periodic lattice structure.

* * * * *